United States Patent
Niu et al.

(10) Patent No.: US 11,625,296 B2
(45) Date of Patent: Apr. 11, 2023

(54) DRAM ASSIST ERROR CORRECTION MECHANISM FOR DDR SDRAM INTERFACE

(71) Applicant: Samsung Electronics Co., Ltd., Suwon-si (KR)

(72) Inventors: Dimin Niu, Sunnyvale, CA (US); Mu-Tien Chang, San Jose, CA (US); Hongzhong Zheng, Los Gatos, CA (US); Hyun-Joong Kim, Hwaseong-si (KR); Won-hyung Song, Osan-si (KR); Jangseok Choi, Campbell, CA (US)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 17/319,844

(22) Filed: May 13, 2021

(65) Prior Publication Data
US 2021/0294697 A1 Sep. 23, 2021

Related U.S. Application Data

(60) Continuation of application No. 16/276,369, filed on Feb. 14, 2019, now Pat. No. 11,010,242, which is a
(Continued)

(51) Int. Cl.
*G06F 11/00* (2006.01)
*G06F 11/10* (2006.01)
(Continued)

(52) U.S. Cl.
CPC ...... *G06F 11/1068* (2013.01); *G06F 11/1048* (2013.01); *G11C 5/04* (2013.01); *G11C 29/42* (2013.01); *G11C 29/52* (2013.01)

(58) Field of Classification Search
CPC ............ G06F 11/1068; G06F 11/1048; G06F 3/0679; G06F 11/108; G06F 12/0246;
(Continued)

(56) References Cited

U.S. PATENT DOCUMENTS

| 5,631,909 A | 5/1997 | Weng et al. |
| 5,740,188 A | 4/1998 | Olarig |

(Continued)

FOREIGN PATENT DOCUMENTS

| CN | 101110048 A | 1/2008 |
| CN | 101681283 A | 3/2010 |

(Continued)

OTHER PUBLICATIONS

Bodnar, L., et al., "A Single Error Correction Double Burst Error Detection Code", Conference Record of the 37th Asilomar Conference on Signals, Systems and Computers (IEEE Cat. No. 03CH37493), vol. 1, 2003; pp. 1118-1121, http://www.chapelle.me/areg/AsilomarNov2003.pdf.

(Continued)

*Primary Examiner* — Esaw T Abraham
(74) *Attorney, Agent, or Firm* — Lewis Roca Rothgerber Christie LLP

(57) ABSTRACT

A method of correcting a memory error of a dynamic random-access memory module (DRAM) using a double data rate (DDR) interface, the method includes conducting a memory transaction including multiple bursts with a memory controller to send data from data chips of the DRAM to the memory controller, detecting one or more errors using an ECC chip of the DRAM, determining a number of the bursts having the errors using the ECC chip of the DRAM, determining whether the number of the bursts having the errors is greater than a threshold number, determining a type of the errors, and directing the memory
(Continued)

controller based on the determined type of the errors, wherein the DRAM includes a single ECC chip per memory channel.

11 Claims, 8 Drawing Sheets

Related U.S. Application Data division of application No. 15/286,460, filed on Oct. 5, 2016, now Pat. No. 10,268,541.

(60) Provisional application No. 62/375,381, filed on Aug. 15, 2016.

(51) Int. Cl.
    *G11C 5/04*     (2006.01)
    *G11C 29/42*     (2006.01)
    *G11C 29/52*     (2006.01)

(58) Field of Classification Search
    CPC ........ G06F 11/1016; G06F 11/14; G11C 5/04; G11C 29/42; G11C 29/04; G11C 29/52
See application file for complete search history.

(56) References Cited

U.S. PATENT DOCUMENTS

| | | | |
|---|---|---|---|
| 5,841,782 A | 11/1998 | Mock et al. | |
| 6,216,247 B1 | 4/2001 | Creta et al. | |
| 6,438,560 B1 | 8/2002 | Loen | |
| 6,779,149 B1 | 8/2004 | Dong | |
| 6,986,072 B2 | 1/2006 | Nishio et al. | |
| 7,043,679 B1 | 5/2006 | Keltcher et al. | |
| 7,320,086 B2 | 1/2008 | Majni et al. | |
| 7,509,568 B2 | 3/2009 | Kapur et al. | |
| 7,650,460 B2 | 1/2010 | Cheriton | |
| 7,721,140 B2 | 5/2010 | Dell et al. | |
| 7,765,441 B2 | 7/2010 | Peeters et al. | |
| 7,949,931 B2 | 5/2011 | Lastras-Montano | |
| 8,041,990 B2 | 10/2011 | O'Connor et al. | |
| 8,276,942 B2 | 10/2012 | Van Druff et al. | |
| 8,566,662 B2 | 10/2013 | Suneya | |
| 8,566,669 B2 | 10/2013 | Schuette | |
| 8,612,828 B2 | 12/2013 | Brzezinski | |
| 8,869,005 B2 | 10/2014 | Jeddeloh | |
| 8,935,592 B2 | 1/2015 | Campbell et al. | |
| 8,966,348 B2* | 2/2015 | Yoon | G06F 11/073 714/776 |
| 8,996,950 B2 | 3/2015 | Desireddi | |
| 8,996,960 B1* | 3/2015 | Saxena | G06F 11/1048 714/773 |
| 9,043,674 B2* | 5/2015 | Wu | H03M 13/616 714/761 |
| 9,116,700 B2* | 8/2015 | Chinnakkonda Vidyapoornachary | G06F 11/106 |
| 9,136,007 B2 | 9/2015 | Shirakawa | |
| 9,201,725 B2 | 12/2015 | Yun | |
| 9,263,157 B2 | 2/2016 | Kilmer et al. | |
| 9,280,418 B2 | 3/2016 | Kao et al. | |
| 9,281,970 B2 | 3/2016 | Ran | |
| 9,431,129 B2 | 8/2016 | Kim et al. | |
| 9,444,801 B2 | 9/2016 | Benedict et al. | |
| 9,483,348 B2 | 11/2016 | Yun | |
| 9,529,543 B1 | 12/2016 | Chinnakkonda Vidyapoornachary et al. | |
| 9,600,359 B2 | 3/2017 | Udipi et al. | |
| 9,653,146 B2* | 5/2017 | Ware | G06F 13/1684 |
| 9,684,107 B2 | 6/2017 | Wang | |
| 9,691,505 B2 | 6/2017 | Das et al. | |
| 9,710,324 B2* | 7/2017 | Trombley | G06F 11/1012 |
| 9,760,435 B2* | 9/2017 | Das | G06F 11/1068 |
| 9,898,365 B2 | 2/2018 | Muralimanohar et al. | |
| 10,031,802 B2* | 7/2018 | Vogt | G06F 11/1052 |
| 10,185,515 B2 | 1/2019 | Shin et al. | |
| 10,379,939 B2 | 8/2019 | Malladi et al. | |
| 10,580,719 B2 | 3/2020 | Kang et al. | |
| 10,621,040 B2* | 4/2020 | Yoon | G06F 11/1076 |
| 10,628,248 B2 | 4/2020 | Chinnakkonda Vidyapoornachary et al. | |
| 2014/0157054 A1* | 6/2014 | Yoon | G06F 11/0751 714/33 |
| 2015/0082122 A1 | 3/2015 | Udipi et al. | |
| 2015/0089111 A1 | 3/2015 | Bains et al. | |
| 2015/0254003 A1 | 9/2015 | Lee et al. | |
| 2015/0309873 A1* | 10/2015 | Yoon | G06F 11/1012 714/766 |
| 2016/0011940 A1 | 1/2016 | Hu et al. | |

FOREIGN PATENT DOCUMENTS

| | | |
|---|---|---|
| CN | 103811076 A | 5/2014 |
| CN | 103839595 A | 6/2014 |
| CN | 105493061 A | 4/2016 |
| CN | 105575425 A | 5/2016 |
| JP | 2014-93092 A | 5/2014 |
| KR | 10-2016-0007440 A | 1/2016 |
| TW | 201604489 A | 2/2016 |
| TW | 201619975 A | 6/2016 |
| WO | WO 2009/000639 A2 | 12/2008 |

OTHER PUBLICATIONS

Office Action issued in U.S. Appl. No. 16/276,304 by the USPTO, dated Sep. 10, 2020, 10 pages.
Taiwanese Patent Office Notice of Allowance and Search Report for corresponding Taiwanese Patent Application No. 106121723, dated Sep. 18, 2020, 3 pages.
DDR3 SDRAM High-Performance Controller User Guide, ALTERA, Mar. 2009, 57 pages.
Main Memory Technology, Processor Supporting Technology—A World that Pursues Endless Speed, EB + DB PRESS plus series, 22 Pages.
Victim cache, Computer Architecture, 13 pages.

* cited by examiner

DRAM ASSIST ERROR CORRECTION MECHANISM FOR DDR SDRAM INTERFACE

CROSS-REFERENCE TO RELATED APPLICATION

This application is a continuation of U.S. patent application Ser. No. 16/276,369, filed Feb. 14, 2019, now U.S. Pat. No. 11,010,242 issued on May 18, 2021, which is a divisional of U.S. patent application Ser. No. 15/286,460, filed Oct. 5, 2016, now U.S. Pat. No. 10,268,541, which claims priority to, and the benefit of, U.S. Provisional Application 62/375,381, filed on Aug. 15, 2016 in the U.S. Patent and Trademark Office, the entire contents of each of which are incorporated herein by reference.

FIELD

One or more aspects of embodiments according to the present invention relate to methods and mechanisms for memory error correction.

BACKGROUND

Double data rate synchronous dynamic random-access memory (DDR SDRAM) is a type of memory integrated circuit (IC) used in computers. DDR SDRAM is able to achieve faster transfer rates by using timing control of electrical data and clock signals, and is able to transfer data both on the rising edge and on the falling edge of the clock signal, thereby effectively doubling data bus bandwidth when compared to a single data rate SDRAM interface utilizing the same clock frequency, and thereby achieving nearly double the bandwidth.

Different generations of DRAM are able to use error-correcting code (ECC) memory during data storage to both detect and sometimes correct common types of data corruption. ECC memory is immune to single-bit errors through use of parity checking. In DRAM systems, parity checking is accomplished by storing a redundant parity bit representing the parity (odd or even) of data (e.g., one byte of data) stored in memory (e.g., stored in a parity device, or in an ECC chip, of the DRAM module), by independently computing the parity, and by comparing the stored parity to the computed parity to detect whether a data error/memory error has occurred.

Accordingly, to ensure that data retrieved from the DRAM module (e.g., a dual in-line memory module (DIMM)), which may correspond to a data word or data symbol, is the same as the data written to the DRAM module, ECC can correct errors that arise when one or more bits of the data are flipped to the wrong state.

That is, by using ECC redundancy, the ECC chip is capable of single error correction double error detection (SEC-DED), meaning that the ECC chip is able to detect the existence of two errors occurring in a single burst, and is also able to correct a single erroneous bit when occurring in isolation. That is, if one data chip is corrupted or lost, by using data of the remaining data chips and ECC data of the ECC chip, the data of the corrupted or missing data chip can be reconstructed.

Additionally, DRAM systems may have chipkill mechanisms for erasing, or disabling, nonfunctional data chips. Various chipkill mechanisms for DDR4 use two or more ECC devices/chips per memory channel to detect, locate, and erase nonfunctional chips.

For example, normal DDR4 has a prefetch length of 8n, a burst length of 8 (i.e., 8 bursts per memory transaction), and a memory channel width of sixty-four bits, where n is a number of bits of an interface width of the data used in the corresponding system architecture (e.g., if the interface width is 4-bit, then the prefetch length of the corresponding DDR4 system is 32 bits). Accordingly, DDR4 will transmit 512 bits for each memory transaction.

To continue increasing DDR interface bandwidth, a new DDR interface may increase the prefetch length. This new DDR interface may have prefetch length of 16n, which is twice of the prefetch length of current DDR4 interface. The new DDR interface will, therefore, transfer twice the amount of data transferred by the DDR4 system for each memory transaction. This new DDR interface may also have a burst length of 16 (i.e., sixteen bursts of data in each individual memory transaction), and a memory channel width of 32 bits per memory channel, and will therefore also transmit 512 bits per memory channel per memory transaction. However, this DDR interface has two memory channels per DIMM, each DIMM being a module having multiple DRAM chips on a circuit board including chip pins to enable connection to a computer motherboard. The two memory channels of the DDR DIMM effectively work independently of one another.

Despite having a narrower memory channel than DDR4, the new DDR interface has a data width of 32 bits per memory channel, with eight data devices (e.g., 4-bit data chips) being configured to store and transfer data for each memory channel. This new DDR interface also has an ECC width of four bits per memory channel with one 4-bit ECC chip for each memory channel. Accordingly, to compensate for having half of the memory channel width of DDR4, this new DDR interface has twice the burst length as DDR4. Because this new DDR interface has two memory channels, each memory channel having eight 4-bit data chips dedicated to storing data, there will be a total of sixty-four bits of memory data per burst.

Furthermore, unlike DDR4, which has two ECC chips per memory channel, this new DDR interface may have a single ECC chip per memory channel, or even a single ECC chip per DIMM, to protect the 16 data chips used for storing data. The new DDR interface can therefore have reduced ECC overhead when compared to DDR4. Accordingly, if a new DDR interface uses one ECC chip per memory channel, for every burst there will be eight bits of ECC data corresponding to the two 4-bit ECC chips, one ECC chip being in each of the two memory channels of the DIMM. Accordingly, such a new DDR interface will transmit 72 bits of data for every burst.

It may be difficult to maintain DDR reliability, availability, and serviceability (RAS) using current DDR4 techniques, as system ECC overhead increases with the corresponding decrease in data width. Furthermore, chipkill techniques require additional ECC overhead due to the increased number of memory channels per DIMM.

Accordingly, it may be useful to provide novel methods of error correction and data recovery, and to provide a DRAM DIMM that is able to correct some types of memory errors internally without assistance from a memory controller, and that is able to direct the memory controller to assist in memory correction for other types of errors that the DRAM is unable to correct internally.

SUMMARY

Aspects of embodiments of the present disclosure are directed toward a new DDR interface that uses in-DRAM ECC to enable error correction.

According to an embodiment of the present invention, there is provided a method of correcting a memory error of a dynamic random-access memory module (DRAM) using a double data rate (DDR) interface, the method including conducting a memory transaction including multiple bursts with a memory controller to send data from data chips of the DRAM to the memory controller, detecting one or more errors using an ECC chip of the DRAM, determining a number of the bursts having the errors using the ECC chip of the DRAM, determining whether the number of the bursts having the errors is greater than a threshold number, determining a type of the errors, and directing the memory controller based on the determined type of the errors, wherein the DRAM includes a single ECC chip per memory channel.

Detecting the one or more errors using the ECC chip of the DRAM may include performing a parity check for each of the bursts using the ECC chip.

The method may further include directing the memory controller to retry a memory read from the DRAM when the number of the bursts having errors is not greater than the threshold number.

The method may further include detecting an additional error when the memory controller retries the memory read, and determining whether the additional error has an error pattern that is the same as the detected one or more errors.

The method may further include directing the memory controller to again retry a memory read from the DRAM when it is determined that the additional error has an error pattern that is different than the detected one or more errors.

The method may further include identifying a hard error when it is determined that the additional error has a same error pattern as the detected one or more errors, directing the memory controller to assist the DRAM in error correction, and logging an address of the error.

The method may further include determining whether the one or more errors correspond to a same pin of a same chip when the number of the bursts having the errors is greater than the threshold number.

The method may further include determining the error corresponds to a DQ failure when it is determined that the one or more errors correspond to a same pin of a same chip of the DRAM, and determining the one or more errors correspond to a chip failure when it is determined that the one or more errors do not correspond to the same pin of the same chip.

The directing the memory controller may include directing the memory controller to assist in chipkill detection when the one or more errors correspond to the DQ failure or to the chip failure.

The method may further include determining whether the one or more errors correspond to more than one chip of the DRAM when the number of the bursts having the errors is greater than the threshold number, marking a corresponding chip of the DRAM as erased when it is determined that the one or more errors correspond to a same chip of the DRAM, and identifying a fatal error when it is determined that the one or more errors correspond to more than one chip of the DRAM.

The method may further include determining whether another chip of the DRAM has been previously erased when the number of the bursts having the errors is greater than the threshold number, and identifying a fatal error when the another chip of the DRAM has been previously erased.

According to another embodiment of the present invention, there is provided a dynamic random-access memory module (DRAM) configured to communicate with a memory controller via a double data rate (DDR) interface, the DRAM including two memory channels, each memory channel including multiple data chips configured to store data thereon, and configured to deliver the data to the memory controller once during each of multiple bursts corresponding to a single memory transaction, and a single error-correcting code (ECC) chip configured to determine a number of the multiple bursts having a memory error corresponding to one or more of the data chips.

The ECC chip may be configured to detect an error, and may be configured to determine a type of the detected error as one of a DQ failure, a chip failure, a soft error, or a hard error.

The ECC chip may be configured to direct the memory controller to assist in chipkill detection or to assist in error correction depending on the determined type of the detected error.

The ECC chip may be configured to issue a command to the memory controller when the ECC chip has detected an error such that the memory controller performs an information readout of the ECC chip.

The DRAM may further include a single pin coupled to the ECC chip that is configured to alert the memory controller during the memory transaction when the ECC has detected an error by using a 1-bit ECC flag.

The data chips and the ECC chip may be configured to deliver an additional burst, which is in addition to the multiple bursts, to the memory controller during each memory transaction to provide readout information of the ECC chip to the memory controller.

According to another embodiment of the present invention, there is provided a memory system including a memory controller, and a dynamic random-access memory module (DRAM) including data chips and error-correcting code (ECC) chips, wherein each of the ECC chips are configured to correct some errors of a corresponding memory channel of the DRAM, and wherein the memory controller is configured to assist the ECC chips to correct other errors that the ECC chips are not able to correct.

Each of the ECC chips may include a pin for sending a 1-bit ECC flag to the memory controller upon detecting an error.

The DRAM may include a plurality of memory channels, and each memory channel of the DRAM may include a single one of the ECC chips.

BRIEF DESCRIPTION OF THE DRAWINGS

These and other aspects of the present invention will be appreciated and understood with reference to the specification, claims, and appended drawings wherein:

DETAILED DESCRIPTION

Figure 1:
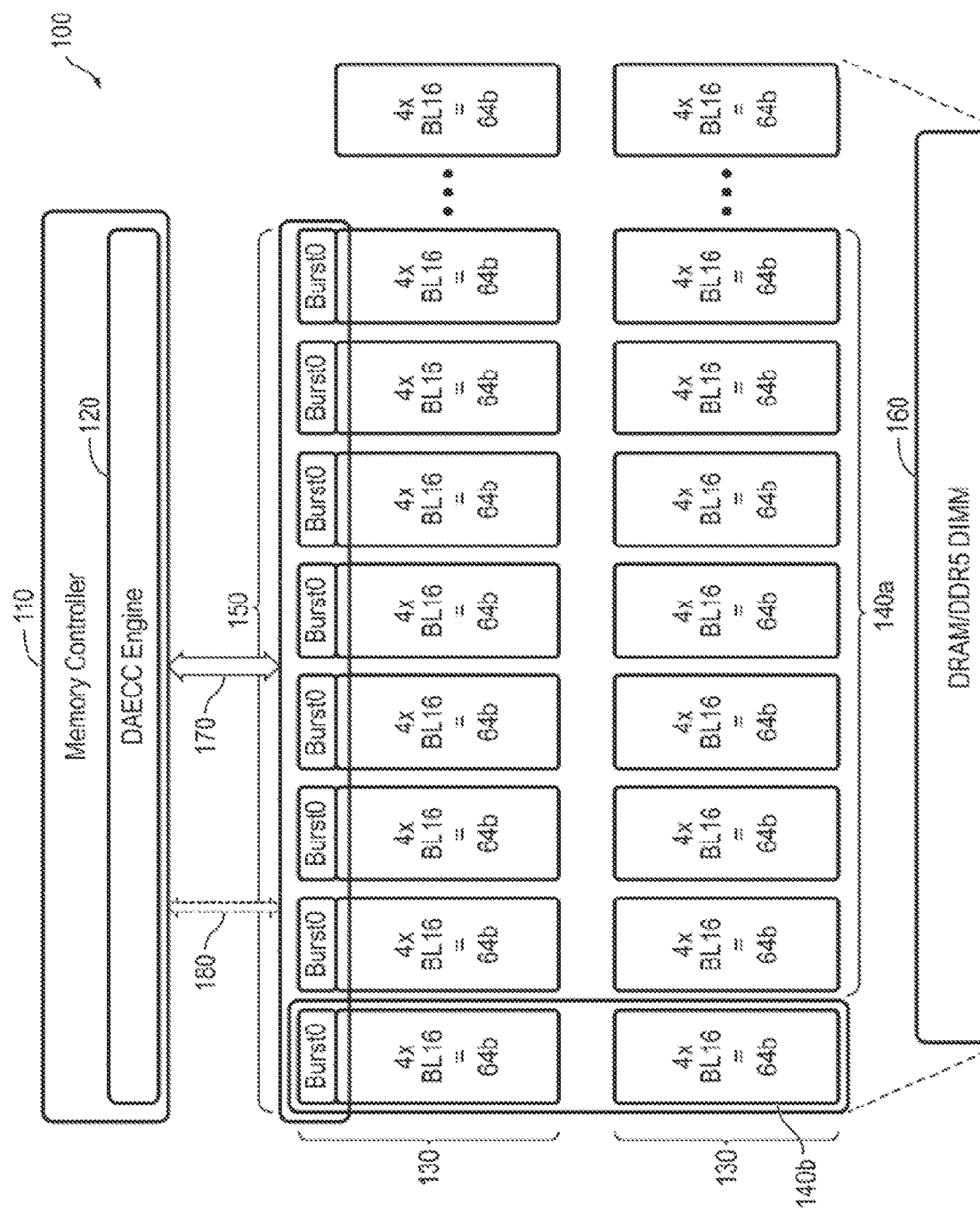
FIG. 1 is a block diagram depicting an error correction mechanism for a DDR interface according to an embodiment of the present invention.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
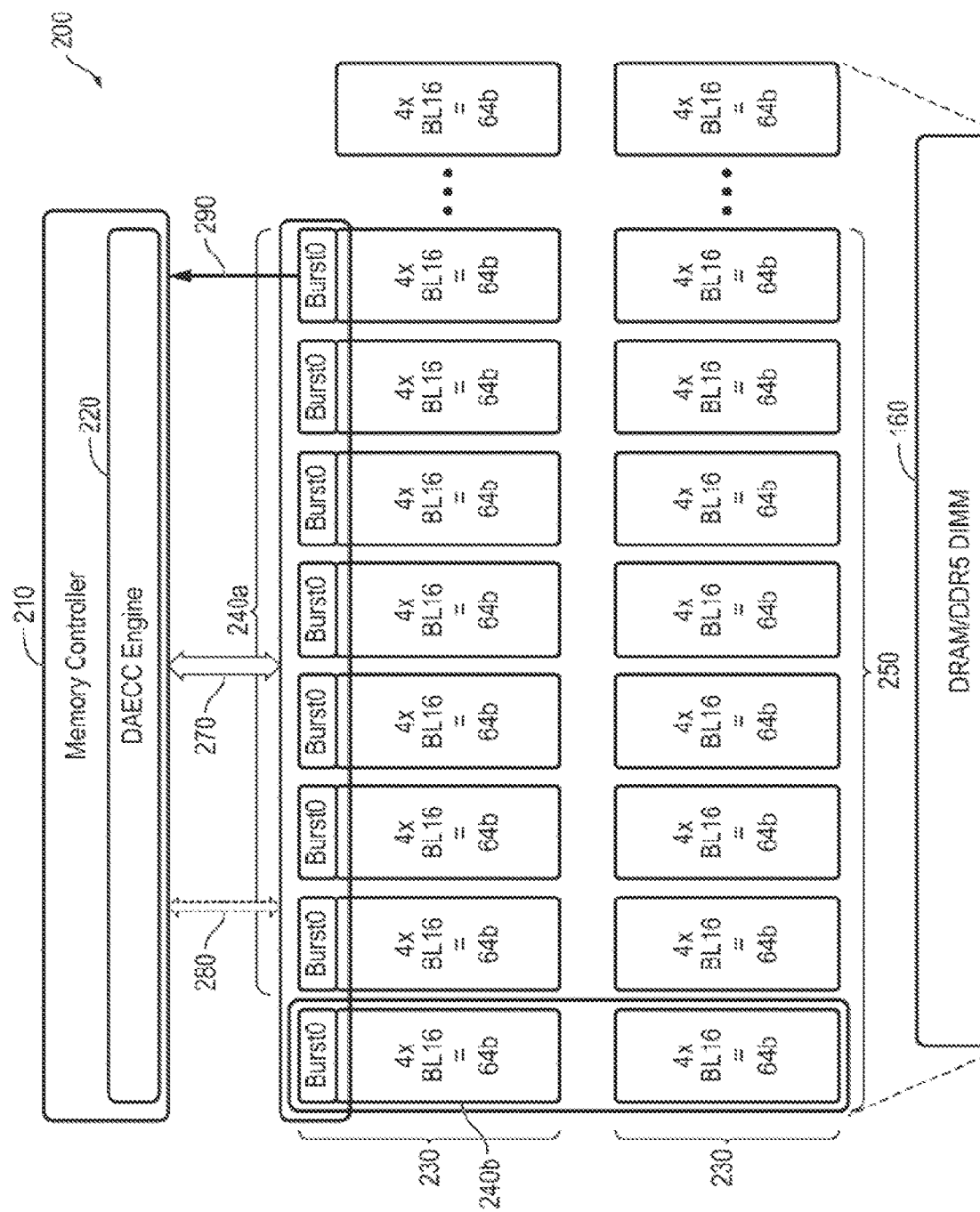
FIG. 2 is a block diagram depicting an error correction mechanism for a DDR interface according to another embodiment of the present invention.
Figure 3:
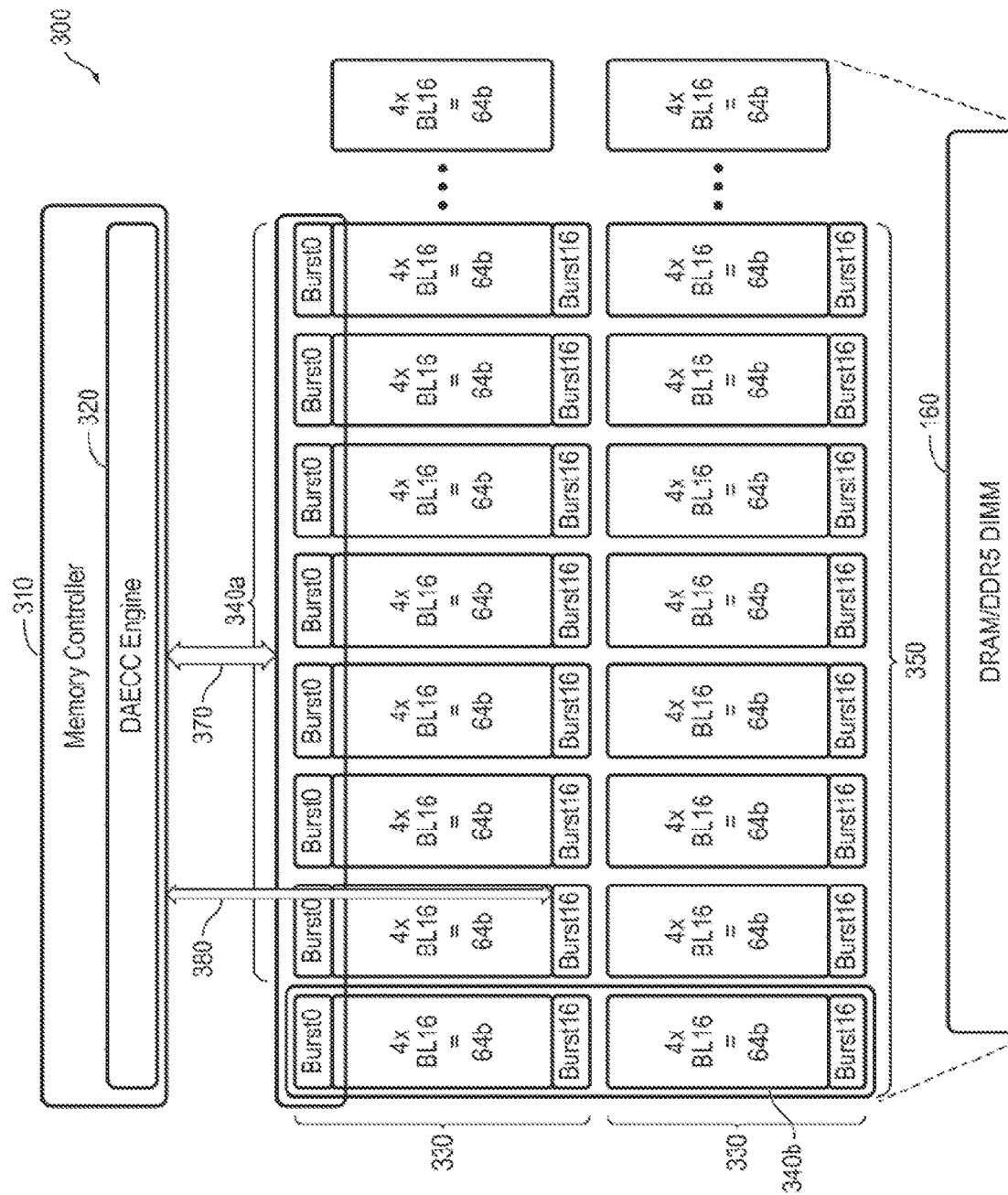
FIG. 3 is a block diagram depicting an error correction mechanism for a DDR interface according to yet another embodiment of the present invention.

The embodiments of the present invention described below with respect to FIGS. 1, 2, and 3 are able to provide basic chipkill. Despite lacking the same coverage as the chipkill mechanism of DDR4, the new DDR interface is able to provide single die/chip correction despite only having one ECC chip per memory channel. Additionally, the mechanisms described below are able to use ECC information provided from the ECC chip to identify when a data chip has failed.

FIG. 1 is a block diagram depicting an error correction mechanism for a DDR interface according to an embodiment of the present invention. The present embodiment uses sixteen bursts per memory transaction, and is able to use in-DRAM ECC to protect data in one data chip within multiple bursts. The present embodiment also allows the DRAM DIMM to use system/memory controller ECC to protect data from multiple chips within one or more bursts by allowing the memory controller to readout information of the in-DRAM ECC when the in-DRAM ECC determines that a system ECC error has occurred.

As can be seen in FIG. 1, a system 100 of an embodiment of the present invention includes a memory controller 110 that has a DRAM Assist Error Correction Code (DAECC) engine 120 stored therein. The memory controller 110 is able to transfer data to and from the various chips 140 of the double data rate synchronous dynamic random-access memory dual in-line memory module (DDR DIMM)/DRAM 160. In FIG. 1, one memory channel 150 of the DRAM 160 is shown. The memory controller 110 conducts memory transactions 130 for exchanging "normal" data 170 with the DRAM 160 through normal read and write processes. In the present embodiment, each chip 140 of the DRAM 160 provides four bits of information via the four pins of the chip.

Each memory channel 150 of the DRAM 160 has eight 4-bit data chips (e.g., eight data devices) 140a for receiving, storing, and transmitting data. Unlike DDR4, which uses two ECC chips per memory channel of the DIMM/DRAM module, the DRAM 160 of the present embodiment has a single 4-bit ECC chip (e.g., one parity device, or parity chip) 140b per memory channel 150 for transferring ECC data to the memory controller 110. Despite having only a single ECC chip 140b per memory channel 150, the DRAM 160 of the present embodiment is able to provide in-system error correction and basic chip-kill capability, as will be discussed further below.

In the present embodiment, the DRAM 160 conducts memory transactions 130 with the memory controller 110 using bursts, whereby the DRAM 160 transmits data repeatedly while omitting other steps that would otherwise be commonly required to transmit each piece of data in a separate transaction. Accordingly, the DRAM 160 is able to transfer data faster than it could without bursting, although only for limited periods of time under particular conditions.

To compensate for the narrower memory channel width of the DRAM 160, the DRAM 160 has a burst length of 16 that is twice that of the DIMM used with DDR4, which has a burst length of 8. That is, to compensate for each of the two memory channels 150 having only half of the data width of a memory channel used with DDR4, the DRAM 160 is able to internally prefetch twice the number of bursts of the data stored on each of the 4-bit chips 140 for each memory transaction 130 when compared to DDR4.

Accordingly, 36 bits (i.e., four bits per chip for each of the nine chips 140) per memory channel 150 are sent for each burst, the data width being 32 bits per memory channel 150, and the ECC width being four bits per memory channel 150. This corresponds to a total of 576 bits per memory transaction 130 per channel (i.e., 36 bits per burst multiplied by sixteen bursts per memory transaction 130), the entire data block being 512 bits, and the remaining sixty-four bits corresponding to ECC data of the ECC chip 140b of the memory channel 150.

Additionally, and unlike DDR4, the system 100 of the present embodiment is able to achieve error correction inside of the DRAM 160 without assistance from the memory controller 110. The in-DRAM ECC of the DRAM 160 performs internal error correction, without communicating with the memory controller 110, to enable data to be protected in one of the data chips 140a within multiple bursts, while the memory controller-assisted error correction allows data to be protected within multiple data chips 140a within one or more bursts. Accordingly, by using the ECC of the memory controller 110 along with internally provided information from the in-DRAM ECC of the DRAM 160, the system 100 is able to use the memory controller 110 and the DRAM 160 to work in conjunction to perform error correction.

For every group of 128 bits in the DRAM, by using a single ECC chip 140b to perform internal error detection at the DRAM level (i.e., without assistance form the memory controller 110), the in-DRAM ECC is able to correct a single bit of error using the ECC bits generated internally inside the chip. The present embodiment does not provide any change in the memory application over that of DDR4, and does not provide a different interface between the DRAM 160 and the memory controller 110. Accordingly, by providing internal ECC, error recovery information is not contained within the normal data transfer 170, and is not communicated to the memory controller. Correction of errors by the ECC chip 140b will therefore not impact the speed or performance of the memory transaction 130 with the memory controller 110.

Certain types of errors, however, are unable to be corrected by the ECC chip 140b alone. When the memory controller 110 detects an error in the data (e.g., when the DRAM 160 indicates the existence of an error to the memory controller 110), only then will the memory controller 110 issue some command to the DRAM 160 to attempt to correct the error. That is, the memory controller 110 will send a special command to the DIMM and receive from the DRAM 160 information contained in an in-DRAM ECC information readout 180 only when a system/memory controller ECC error happens. Thereafter, the memory controller 110 will determine which of the eight data chips 140a of the corresponding memory channel 150 is responsible for the detected error. The method the memory controller 110 uses to locate the faulty data chip is described further below with respect to FIGS. 7A-7B.

FIG. 2 is a block diagram depicting an error correction mechanism for a DDR interface according to another embodiment of the present invention. Like the error correction mechanism of the previously described embodiment, the present embodiment conducts sixteen bursts per memory transaction. Similarly, the memory controller 210 has a DAECC engine 220 stored therein, and each memory channel 250 of the DRAM 260 has eight data chips 240a and one ECC chip 240b for exchanging normal data 270. However, unlike the previous embodiment, the DRAM 260 alerts the memory controller of an ECC error by sending a 1-bit ECC flag to the memory controller via an additional pin.

Referring to FIG. 2, the system 200 of the present embodiment is similar to the system 100 of the embodiment described with respect to FIG. 1. The DRAM/DDR DIMM 260 of the present embodiment, however, implements a single additional pin 290 to enable the DRAM 260 to easily deliver ECC information to the memory controller 210. Unlike the previous embodiment, uncorrectable errors within the DRAM 260 are always exposed to the memory controller 210 immediately, as the DRAM 260 is able to transmit an alert consisting of a single 1-bit ECC flag when an error occurs during the memory transaction 230 comprising sixteen bursts. Accordingly, information is provided from the in-DRAM ECC chip 240b of the chips 240 to the memory controller 210 when an error occurs.

Accordingly, when a memory error corresponding to one of the eight data chips 240a occurs, then the pin 290 of the ECC chip 240b of the present embodiment will be used to set the 1-bit ECC flag to alert the memory controller 210 that an error has occurred. Upon detecting the 1-bit ECC flag through the pin 290, the memory controller 210 will issue a special command to obtain more detailed information from the DRAM 260 regarding the error. The memory controller 210 may obtain the information from the DRAM 260 by using an in-DRAM ECC information readout 280 in a manner similar to the system 100 of the embodiment described with respect to FIG. 1.

Unlike the embodiment of the system 100 described with respect to FIG. 1, the DDR interface between the DRAM 260 and the memory controller 210 is modified from DDR4. However, performance is not negatively impacted, because the 1-bit ECC flag is transferred via the pin 290 along with the other 576 bits of data, and therefore does not increase the amount of time per memory transaction 230.

FIG. 3 is a block diagram depicting an error correction mechanism for a DDR interface according to yet another embodiment of the present invention.

Referring to FIG. 3, when compared to the systems 100 and 200 of the embodiments respectively described with reference to FIGS. 1 and 2, the present embodiment has a memory controller 310 with a DAECC engine 320 stored therein, and each memory channel 350 of the DRAM 360 has eight data chips 340a and one ECC chip 340b for exchanging normal data 370. However, each memory transaction 330 of the system 300 of the present embodiment has an additional burst contributing to a total burst length of seventeen bursts. During the seventeenth burst of the memory transaction 330, however, the ECC information determined during the in-DRAM error correction is transferred from the DRAM/DDR DIMM 360 to the memory controller 310 in an in-DRAM ECC information readout 380. Accordingly, the memory controller 310 is able to identify the in-DRAM ECC information in each memory transaction 330 at the cost of decreased performance associated with the additional burst for each memory transaction 330.

Accordingly, unlike the system 100 of the embodiment of FIG. 1, in which the memory controller 110 conducts an information readout 180 of the in-DRAM ECC information only when a system/memory controller ECC error occurs (e.g., an error that is unable to be corrected by the ECC chip 140b of the DRAM 160), the memory controller 310 of the present embodiment performs an in-DRAM ECC information readout 380 in every memory transaction 330 through the extra, seventeenth burst. Additionally, the memory controller 310 will always perform the same operations to correct the error as performed by the in-DRAM ECC in the system level (e.g., in the DRAM 360).

Although the embodiments described above describe that a DAECC mechanism may be used for a new narrow DDR interface using 4-bit DRAM chips, the DAECC mechanism can be used in conjunction with other DRAM architectures that use the new DDR interface, or can be used in a DDR4-like interface, if the in-DRAM ECC is performed inside the DRAM chip.

Figure 4:
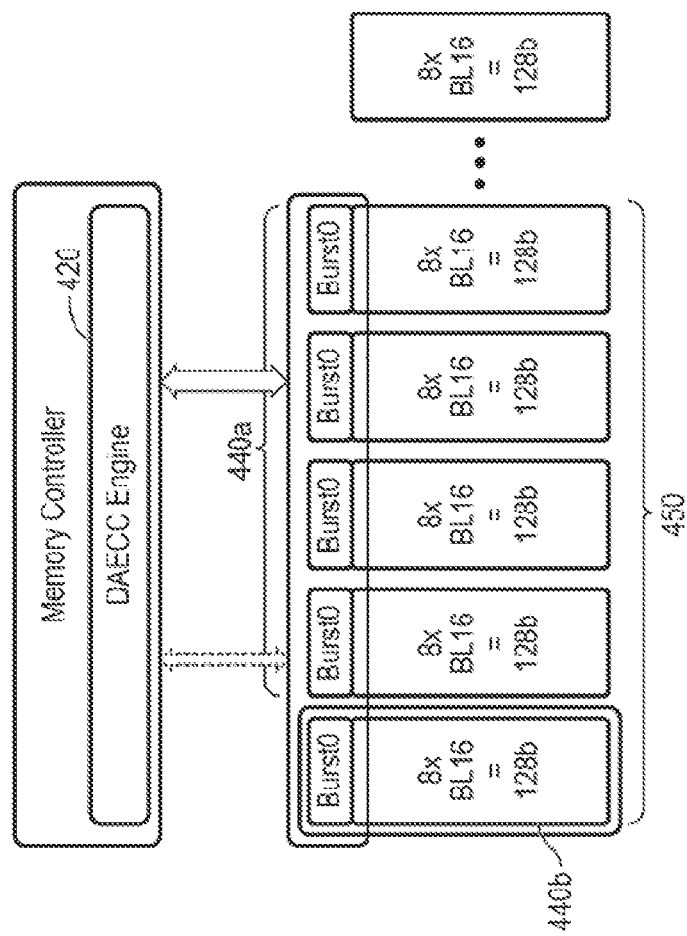
FIG. 4 is a block diagram depicting an error correction mechanism for a DDR interface according to yet another embodiment of the present invention.

For example, FIG. 4 shows that the DAECC engine 420 can be used in connection with the new narrow DDR interface with 8-bit DRAM chips 440. In such an embodiment, each channel 450 has four 8-bit DRAM chips 440a to store data, and one 8-bit DRAM chip 440b to store system ECC. Therefore, the system ECC overhead in the present embodiment is ¼th, or 25%.

Figure 5:
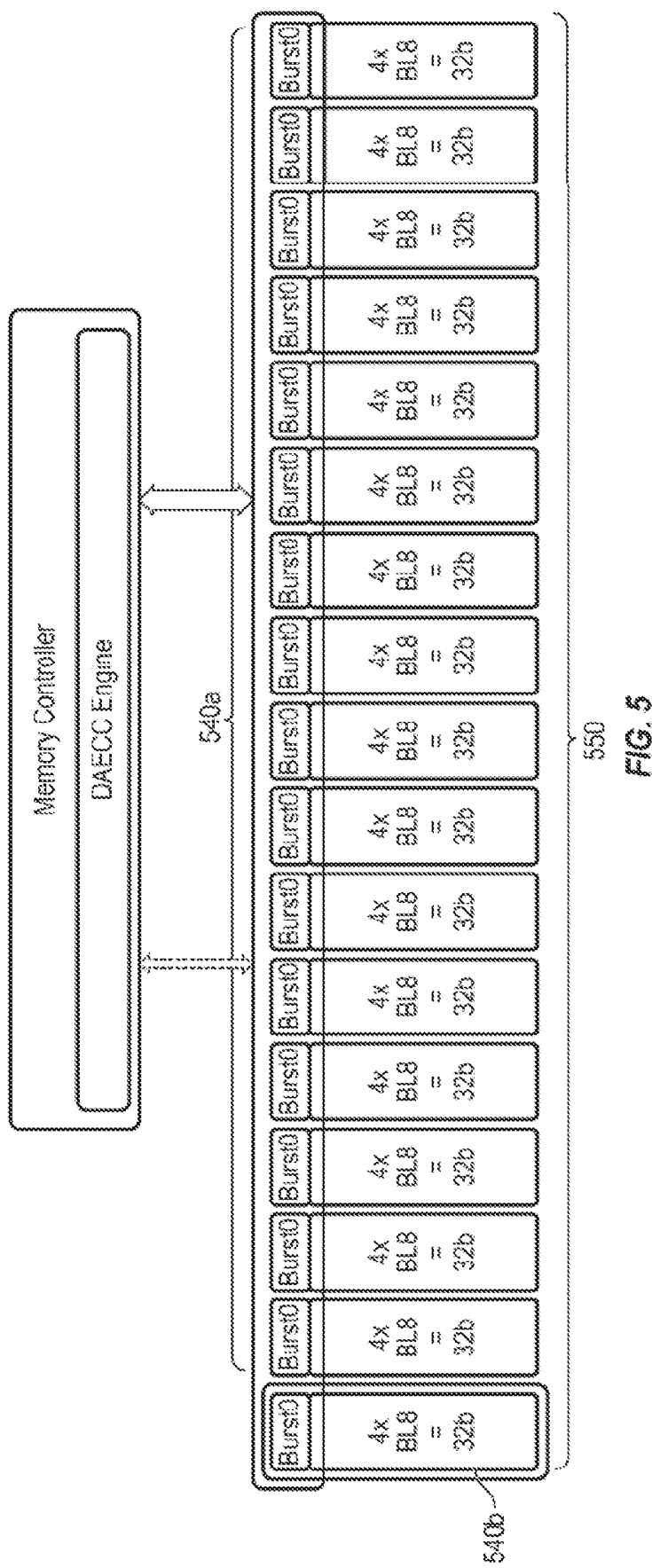
FIG. 5 is a block diagram depicting an error correction mechanism for a DDR interface according to yet another embodiment of the present invention.

As another example, FIG. 5 shows that DAECC can be used in the DDR interface with 4-bit DRAM chips 540. In the present embodiment, each channel 550 has sixteen 4-bit DRAM chips 540a to store data, and one 4-bit DRAM chip 540b to store system ECC. In such an embodiment, the system ECC overhead is, therefore, ¹⁄₁₆, or 6.25%, which is half of the current ECC overhead in DDR4 standard.

Figure 6:
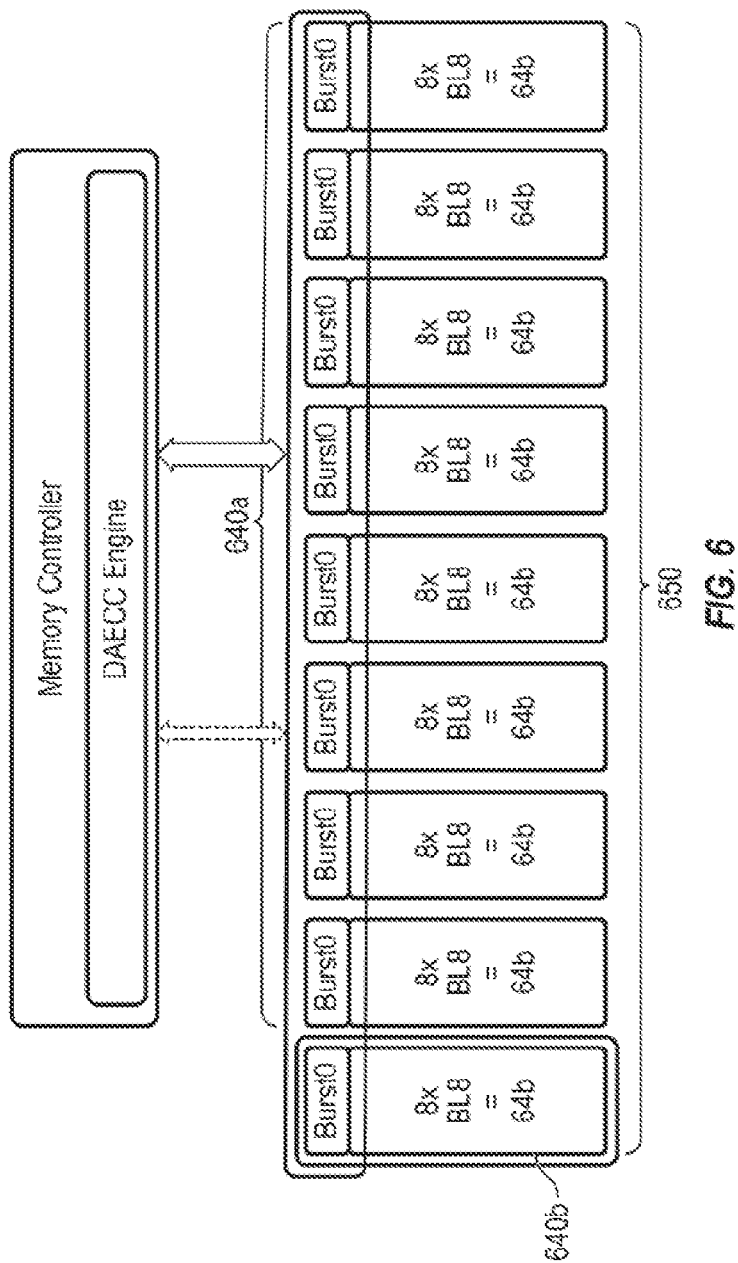
FIG. 6 is a block diagram depicting an error correction mechanism for a DDR interface according to yet another embodiment of the present invention.

As yet another example, FIG. 6 shows that the DAECC mechanism can be used in the DDR4 interface with 8-bit DRAM chips 640. In such an embodiment, each channel 650 has eight 8-bit DRAM chips 640a for storing data, and one 8-bit DRAM chip 640b for storing system ECC. Therefore, the system ECC overhead is ⅛th, or 12.5%.

In summary, the DAECC of the embodiments described above is a general mechanism for using a single additional ECC DRAM chip, and for using in-DRAM ECC information to provide basic chipkill coverage for a memory system with any kind of organization.

Figure 7A:
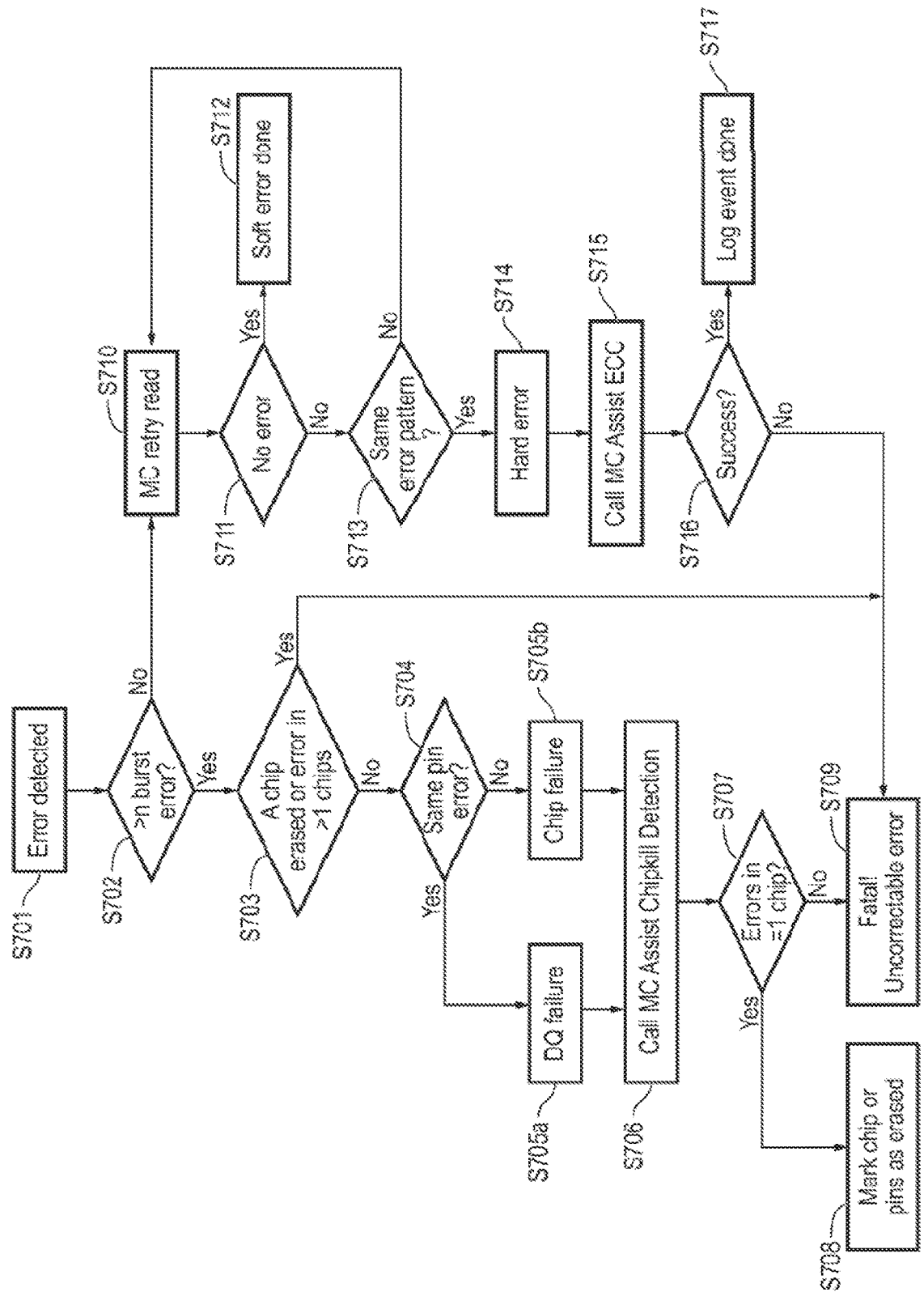
FIGS. 7A-7B are flowcharts depicting detection of an error, determination of a type of the error, and handling of the error using a DRAM Assist Error Correction Code (DAECC) mechanism according to one or more embodiments of the present invention.
Figure 7B:
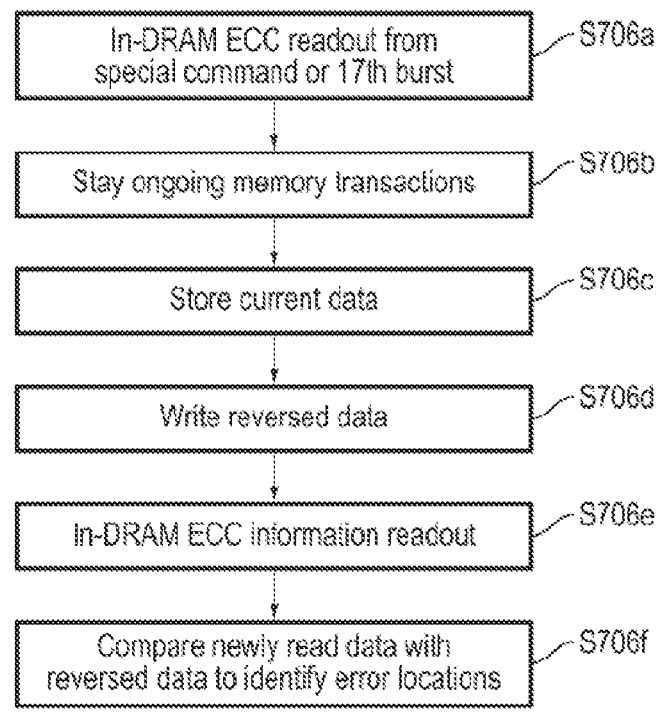

FIGS. 7A-7B are flowcharts depicting detection of an error, determination of a type of the error, and handling of the error using a DAECC mechanism according to one or more embodiments of the present invention.

The flowchart described below may be implemented by any of the systems respectively described with reference to FIGS. 1, 2, 3, 4, 5, and 6. When the memory controller becomes aware of the occurrence of an error in the DRAM, the memory controller may seek to determine the error pattern. According to the error pattern, the memory controller will be able to determine whether the error corresponds to a random error (non-permanent error), a permanent error, or a chipkill error. Upon determining the type of error, the system can perform error correction.

Of the different types of errors, one type of error is referred to as a chipkill error. A chipkill error generally corresponds to a permanent failure of a single chip/die or a chip that exceeded a threshold of bit errors. The failure of a single 4-bit data chip of a memory channel may cause a large number of the four bits corresponding to the data chip to provide erroneous data in a large number of bursts during a memory transaction (e.g., a large number of errors in 4-bit symbols corresponding to the data chip). Accordingly, embodiments of the present invention can detect when a single chip has failed, and can thereafter deactivate the chip while still providing single chip correction. That is, embodiments of the present invention can group the 4 repeatedly erroneous bits corresponding to a single chip as one symbol, and can use a symbol-based mechanism (e.g., parity) to recover the data corresponding to the failed/dead/erased chip.

Another type of error is referred to as a DQ error. As mentioned above, in the DRAM of the described embodiments, each chip has 4 data pins, each pin for outputting one of the four bits stored on the chip. Each pin may be referred to as a DQ. If one of the pins of a single chip has failed (as opposed to the failure of the entire chip), then the data provided from that pin in each of the bursts may potentially be erroneous. Accordingly, a pin failure may be referred to as a DQ error.

The described embodiments may use simple parity algorithms interleaved with each chip. For example, the described embodiments may use a redundant array of independent disks (RAID) configuration (e.g., an organization that is similar to that of RAID 4). RAID 4 is a RAID configuration that uses a dedicated parity disk and block-level striping across multiple disks (e.g., chips). Disk striping includes the division of a group of data into blocks, and spreading the blocks across two or more storage devices (e.g., data chips).

Accordingly, the data stored on the ECC chip will correspond to four parity bits, wherein each bit from a single one of the eight data chips contributes to a different parity bit stored by the ECC chip, and wherein one bit from a corresponding pin of all of the data chips contribute to one of the parity bits (e.g., a single ECC group of the ECC chip). If the host memory controller detects a reoccurring single 1-bit error corresponding to a single pin by using the data and ECC information, the host memory controller will identify the error from the same bit-location of the four possible bit-locations (i.e., the same parity bit of the ECC chip will have errors occurring in several of the bursts). As will be described below, information from a detected error pattern can be used to determine where the error is (e.g., which of the eight data chips has the pin that is causing the error).

Referring to FIG. 7A, at S701, an error is detected. The error may be detected by any of the error detection methods described above with reference to FIGS. 1, 2, and 3 (e.g., the ECC flag being detected by the memory controller 210 via the additional pin 290, or the error being detected by the memory controller 310 in the in-DRAM ECC information readout 380 during the 17$^{th}$ burst of the memory transaction 330) and/or by the system ECC performed in the host memory controller (e.g., RAID-like parity check).

Once the system determines that there is some error from the DRAM/DDR DIMM in S701, it is determined how many of the bursts have the error at S702. This may be performed by doing a parity check for each burst of the memory transaction. Because different types of failures have different error patterns, a threshold, or reference number, "n" may be used to classify the type of error detected. For example, a DQ failure will have only a 1-bit parity error in many or all of the bursts of the memory transaction, although the ECC error will be at a same pin location of the ECC chip. A chip failure, however, will likely have parity error in multiple bits (e.g., 4-bits parity error) in many or all of the bursts. Additionally, a random error may correspond to a small number of errors, such that there will be very few erroneous bits in a small number of bursts (e.g., a single, 1-bit error in a single burst).

Accordingly, if the number of detected errors is greater than a threshold, it may be predicted that a DQ failure or chip failure has occurred. If, however, the number of detected errors is less than or equal to the threshold, then it may be predicted that one or more random error from one or more individual chips has occurred, which is not correctable by the in-DRAM ECC, and may require assistance from the memory controller to correct.

Therefore, at S702, it may be determined whether a number of bursts having an error for a given memory transaction exceeds a threshold "n." Depending on whether the threshold is met, the logic flow proceeds to either S703 or S710. That is, if a sufficient number of bursts are determined to have a parity error (e.g., if the number of bursts having an error in a given memory transaction is above a threshold number "n"), then it is more likely that there has been a DQ failure or chip failure, and the system will go to a chipkill mechanism. If, however, the number bursts having a detected error is less than the threshold number "n" (e.g., 4 bursts or fewer), then it is likely that the error detected at S701 is the result of random failures from an individual chip(s). Such random failures are not correctable by in-DRAM ECC, but because the error will not likely reoccur, the chipkill mechanism is not used.

It should be noted that although a threshold number of 4 bursts is used as an example, a different number may be used in other embodiments of the present invention. Furthermore, the number may be adjusted in other embodiments (e.g., to correspond to a particular device). For example, if a corresponding memory device has a relatively high device error rate, such that multiple random errors occur, the threshold number may be increased.

At S703, once it is determined at S702 that the number of bursts that have a parity error is greater than the threshold number (e.g., greater than 4 bursts), then the system determines that one of the eight data chips is dead or erased, or determines that there has been an error in more than one of the eight data chips.

If it is determined at S703 that a chip has already been previous erased, or that there are errors in more than one of the eight data chips, then the system may determine at S709 that a fatal, uncorrectable error has occurred. The number of chips that have an error may be detected by the memory controller 110, 210, 310 in the in-DRAM ECC information readout 180, 280, 380 either by using the special command or during the 17$^{th}$ burst of the memory transaction 330. For example, if a chip is dead due to a DQ failure, chip failure, bank failure, or row failure, any additional DQ failure or chip failure results in a fatal failure, as the system of the present embodiment only has a single ECC chip per memory channel, and therefore will no longer have sufficient resources to perform error correction. Similarly, if multiple chips have an error, then a fatal failure occurs.

If, however, it is determined at S703 that no chip is erased, and that the detected error corresponds to only a single data chip, the process may move to S704. For example, if no chip has yet been erased, and if the detected error corresponds to only a single chip, the system is able to identify the type of failure, and the memory controller can log the failure type and potentially take further action to correct the error.

At S704, it can be determined whether the detected errors occur at a same pin. That is, at S704, the system determines whether the detected error occurs at the same pin for each of the bursts. If all errors correspond to the same pin, at S705a, the in-DRAM system can report to the memory controller such that the memory controller can log the failure type of the error as a DQ failure. If the system determines that the detected errors are not all at the same pin, at S705b, the in-DRAM system can report to the memory controller such that the memory controller can log the failure type as a chip failure.

At S706, after the failure type is logged as either a DQ failure or as a chip failure, the memory controller is used to assist in chipkill detection. At S706, the memory controller can start a diagnosis routine to determine how to correct the error. The diagnosis routine will be described with reference to FIG. 7B.

Referring to FIG. 7B, at S706a, the memory controller has already read out the in-DRAM ECC information provided from the in-DRAM ECC (e.g., in-DRAM ECC information readout 180, 280, or 380 of the ECC bits provided by the ECC chip) in S703 of FIG. 7A, so that the memory controller can thereafter perform error detection. Thereafter, at S706b, the memory controller will stay all of the ongoing memory transactions. Then, at S706c, the memory controller stores the current data (e.g., 512 bits corresponding to current data D[511:0] of the eight 4-bit data chips). Then, at S706d, the memory controller writes reversed data corresponding to the current data (e.g., 512 bits corresponding to reversed data D'[511:0]) to the eight 4-bit data chips. Then, at S706e, the memory controller reads the data out again. Then, at S706f, the memory controller compares the newly read data with the known reversed data to identify a location(s) of the error(s).

Referring to FIG. 7A, after the memory controller assists in chipkill detection at S706, at S707, the memory controller determines whether all detected errors correspond to a single chip. If only a single data chip is erased, or if multiple DQ errors are detected, but all of the multiple DQ errors correspond to the same chip, at S708, the memory controller will write the data back to the remaining, non-erased chips, and all subsequent memory transactions will use a parity bit of a simple parity algorithm to recover data corresponding to the erased chip. For example, if the memory controller determines, upon reading out the data, that multiple bits corresponding to one of the data chips do not match the corresponding bits of the reversed data written to the data chip at S706d, the memory controller will mark that data chip as erased at S708. However, if the memory controller determines, upon reading out the data, that only one of the bits corresponding to one pin of one of the data chips does not match the corresponding bit of the reversed data written to the data chip at S706d, the memory controller will mark only a single pin of the one chip as erased at S708.

However, if more than one chip is marked as erased, at S709, the memory controller will determine that a fatal, uncorrectable error has occurred. That is, if there are errors in more than one chip, the DRAM will no longer have sufficient resources to perform parity, as there will be no additional chips in reserve, and any additional chip error will be an uncorrectable, fatal error requiring replacement of the DRAM.

Returning to S702, if it is determined that the number of errors is below the threshold number (e.g., only a small number of the bursts of the memory transaction has an error), then at S710, the memory controller retries to read the data from the data chips by receiving an additional burst from the DRAM.

After retrying to read the data at S710, the memory controller determines at S711 whether there is still an error detected. If no additional error is detected at S711, the memory controller determines at S712 that a soft error, or transient error, has occurred, and that no further correction is needed. If, however, an additional error is detected at S711 after retrying to read the data at S710, it is determined at S713 whether the error has the same error pattern as the error initially detected at S701. By determining whether the error has the same error pattern, a case of unmatched soft errors may be ignored, the case being where a soft error is initially detected at S701, and a different, subsequent soft error is detected during the memory controller's retrying to read the data at S710.

If the error detected at S713 does not have the same error pattern as the error initially detected at S701, the process returns to S710, and the memory controller again retries to read the data from the data chips. Accordingly, if sequential and non-identical soft errors occur, thereby resulting in different error patters, the memory controller may continue to attempt to read the data. If, however, the error detected at S712 has the same error pattern as the error initially detected at S701, it is determined at S714 that a hard error (non-transient error), has occurred.

Upon determining the existence of a hard error (non-transient error) at S714, and assuming that no chip has yet been marked as erased, the DRAM triggers the memory controller to assist in correction of the hard error by using the memory controller ECC mechanism at S715. The memory controller may assist in error correction by, for example, comparing a current address of the error (e.g., chip and pin address) with an error address stored in an error register in one or more of the chips on the DRAM. The memory controller may also assist in error correction by using the in-DRAM ECC information. For example, if the in-DRAM ECC information indicates that only one chip has an uncorrectable in-DRAM ECC error, then the memory controller can use the ECC chip to recover the error.

At S716, it is determined whether the memory controller has successfully corrected the hard error. If the error correction is a success, at S717, the operating system may log the error event, and the memory controller may issue another special command to erase the in-DRAM ECC information (e.g., a chip error register) in each chip. If, however, the error correction is not a success (e.g., if one chip has already been erased, and therefore the system no longer has ECC capability), then the memory controller will determine at S709 that a fatal error has occurred.

When the memory controller identifies a fatal, uncorrectable error at S709, the operating system may perform system/application level error recovery. For example, the operating system may retire the corresponding physical page by relocating the content of the page to another physical page, and may place the retired page on a list of physical pages that should not be subsequently allocated by the virtual memory system. As a number of physical pages that are retired increases (e.g., as a number of uncorrectable errors increases), the effective memory capacity of the system is reduced.

Accordingly, embodiments of the present invention provide an architecture capable of providing basic chipkill RAS features, like those provided by DDR4, while providing these features with reduced (e.g., minimal) ECC chip overhead (i.e., one ECC chip per memory channel), reduced (e.g., minimal) internal prefetch size (the prefetch size being the same size of the in-DRAM ECC), and reduced (e.g., minimal) changes of the DDR interface over the interface corresponding to the DDR4. Additionally, embodiments of the present invention provide a 12.5% storage overhead for a new DDR interface with narrower channel width than DDR4, support basic chip-kill capability and system ECC, and support the memory controller assist error detection mechanism.

Furthermore, embodiments of the present invention are able to provide basic chip-kill capability and system ECC despite only having one ECC chip per memory channel. Embodiments of the present invention also provide a mechanism to allow a memory controller to identify the failure chip with assistance from DRAM device, provide a mechanism to readout In-DRAM ECC information (e.g., by using additional burst length, an extra pin, or a register readout from the DRAM), provide a retry mechanism to identify an error type (e.g., whether soft error or hard error), and provide different ECC capability by using either individual or lock-step memory channel, and by using SEC-DEC or chip-kill ECC.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A memory error correction method, the method comprising:
    conducting a memory transaction to send data to a memory controller from a dynamic random-access memory module (DRAM) comprising a memory channel;
    detecting a first memory error using a memory error-correcting code (ECC) chip; and
    determining a characteristic of the first memory error based on a number of memory errors of the memory transaction that match the first memory error.

2. The method of claim 1, wherein detecting the first memory error comprises performing a parity check using the ECC chip.

3. The method of claim 1, further comprising:
    determining the number of bursts of the memory transaction having the first memory error is less than or equal to a threshold number; and
    directing the memory controller to perform a memory read from the DRAM.

4. The method of claim 1, further comprising:
    determining the number of bursts of the memory transaction having the first memory error is greater than a threshold number;
    determining that the first memory error corresponds to a same pin of a same data chip of the DRAM; and
    determining the first memory error corresponds to a DQ failure.

5. The method of claim 1, further comprising:
    determining the number of bursts of the memory transaction having the first memory error is greater than a threshold number;
    determining that the first memory error corresponds to different pins of a data chip; and
    determining the first memory error corresponds to a data chip failure.

6. The method of claim 1, further comprising:
    determining the first memory error is a DQ failure or a data chip failure; and
    directing the memory controller to assist in chipkill detection.

7. The method of claim 1, further comprising:
    determining the number of bursts of the memory transaction having the first memory error is greater than a threshold number;
    determining the first memory error corresponds to a data chip of the DRAM; and
    identifying the data chip as erased.

8. The method of claim 1, further comprising:
    determining the number of bursts of the memory transaction having the first memory error is greater than a threshold number;
    determining that the first memory error corresponds to more than one data chip of the DRAM; and
    identifying a fatal memory error.

9. The method of claim 1, further comprising:
    determining the number of bursts of the memory transaction having the first memory error is greater than a threshold number;
    determining that a data chip of the DRAM has been previously erased; and
    identifying a fatal memory error.

10. A memory error correction method, the method comprising:
    conducting a memory transaction to send data to a memory controller from a dynamic random-access memory module (DRAM) comprising a memory channel having a sole memory error-correcting code ECC chip;
    detecting a first memory error using the ECC chip
    determining a number of bursts of the memory transaction having the first memory error is less than or equal to a threshold number;
    directing the memory controller to perform a memory read from the DRAM;
    detecting a second memory error from the memory read;
    determining that the second memory error has a memory error pattern that is different than the first memory error; and
    directing the memory controller to perform an additional memory read from the DRAM.

11. A memory error correction method, the method comprising:
    conducting a memory transaction to send data to a memory controller from a dynamic random-access memory module (DRAM) comprising a memory channel having a sole memory error-correcting code ECC chip;
    detecting a first memory error using the ECC chip
    determining a number of bursts of the memory transaction having the first memory error is less than or equal to a threshold number;

directing the memory controller to perform a memory read from the DRAM;
detecting a second memory error from the memory read;
determining that the second memory error has a same memory error pattern as the first memory error;
identifying a hard memory error;
directing the memory controller to assist the DRAM in memory error correction; and
logging an address of the first memory error.

* * * * *